United States Patent
Voisine et al.

(10) Patent No.: US 9,349,528 B2
(45) Date of Patent: May 24, 2016

(54) POWER SUPPLY ARRANGEMENT HAVING A BOOST CIRCUIT FOR AN ELECTRICITY METER

(75) Inventors: John Voisine, Lafayette, IN (US); Raj Sundaram, West Lafayette, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 2469 days.

(21) Appl. No.: 12/156,550

(22) Filed: Jun. 2, 2008

(65) Prior Publication Data

US 2009/0015234 A1 Jan. 15, 2009

Related U.S. Application Data

(60) Provisional application No. 60/932,632, filed on Jun. 1, 2007.

(51) Int. Cl.
*H01F 27/42* (2006.01)
*G01R 22/00* (2006.01)

(52) U.S. Cl.
CPC .............. *H01F 27/422* (2013.01); *G01R 22/00* (2013.01)

(58) Field of Classification Search
CPC ................................. G01R 22/00; G01R 21/00
USPC ........... 363/39, 40, 44, 45, 52, 74, 80, 81, 88, 363/108, 123, 125–127, 15, 61; 323/293, 323/298, 259–260, 364–371, 311, 355, 323/358–359; 324/415–417
See application file for complete search history.

(56) References Cited

U.S. PATENT DOCUMENTS

| | | | | |
|---|---|---|---|---|
| 4,445,166 A * | 4/1984 | Berglund et al. | ............... | 363/48 |
| 4,542,337 A * | 9/1985 | Rausch | ................ | 324/110 |
| 4,937,731 A * | 6/1990 | Konopka | ................ | 363/143 |
| 5,481,449 A * | 1/1996 | Kheraluwala et al. | ........ | 363/17 |
| 5,777,866 A * | 7/1998 | Jacobs et al. | ................ | 363/126 |
| 5,898,233 A * | 4/1999 | Sawaki | ................ | 307/38 |
| 6,137,700 A * | 10/2000 | Iida et al. | ................ | 363/89 |
| 6,181,583 B1 * | 1/2001 | Okui et al. | ................ | 363/45 |
| 6,304,460 B1 * | 10/2001 | Cuk | ................ | 363/16 |
| 6,687,137 B1 * | 2/2004 | Yasumura | ................ | 363/21.01 |
| 6,956,753 B1 * | 10/2005 | Ananias | ................ | 363/80 |
| 7,355,867 B2 * | 4/2008 | Shuey | ................ | 363/56.11 |
| 7,656,139 B2 * | 2/2010 | van Ettinger | ................ | 323/280 |

\* cited by examiner

*Primary Examiner* — Adolf Berhane
*Assistant Examiner* — Henry Lee, III
(74) *Attorney, Agent, or Firm* — Maginot, Moore & Beck LLP

(57) ABSTRACT

A power supply arrangement for an electricity meter includes an input, a full wave rectifier, and a voltage doubler circuit. The input is configured to receive a periodical input signal. The full wave rectifier is coupled to the input and has a first output. The first output is coupled to a first load of the electricity meter. The voltage doubler circuit is coupled to the input and has a second output coupled to a second load of the electricity meter. The voltage doubler is configured to prevent the flow of current from the second output to the input.

20 Claims, 4 Drawing Sheets

POWER SUPPLY ARRANGEMENT HAVING A BOOST CIRCUIT FOR AN ELECTRICITY METER

This application claims the benefit of U.S. Provisional Patent Application Ser. No. 60/932,632, filed Jun. 1, 2007, which is incorporated herein by reference.

FIELD OF THE INVENTION

The present invention relates to electricity meters, and in particular, to arrangements for providing power within an electricity meter.

BACKGROUND

Electricity meters are meters that, among other things, measure electrical energy flowing to a load, or at least through a conductor that feeds one or more loads. Electricity meters are often located at domestic residences for the purpose of measuring consumption of electricity by a residence for billing purposes. Electricity meters are also located on larger commercial and industrial structures for similar reasons. Electricity meters are often used for additional purposes, such as tracking energy usage trends, and/or load control.

With respect to load control, electricity meters sometimes include disconnect switches that automatically disconnect and reconnect a load to the utility power lines. Disconnect switches can be used for prepaid electricity services, as well as for load shedding. In prepaid electrical service situations, the disconnect switch automatically disconnects the load from the power lines once the customer has consumed the prepaid amount of energy. When additional energy is purchased, the disconnect switch reconnects the load to the power line. Because disconnect switches connect an entire customer load (such as a residence) to the power lines, the disconnect switch must be able to handle a significant amount of current, such as, for example 200 amperes. Mechanical switches are well-suited for switching currents of this magnitude.

In order to actuate the mechanical switches, an actuator such as a solenoid or motor typically must be used. In one example, the meter assembly includes an actuator in the form of a small motor that actuates the disconnect switch. Linear power supplies have been used to provide the motor driver circuit with power.

A problem has arisen with a residential electricity meter employing a linear power supply and a motor driver circuit. In particular, in one example, the motor driver circuit includes a capacitor that is discharged through a small motor to open or close the 200 ampere switch. The capacitor is then allowed to charge to the maximum level before a subsequent operation is performed. The capacitor provides a reserve of energy that is used to reduce the stress on the linear power supply during the relatively infrequent operation of the switch.

Charging the capacitor to the level of the power supply unregulated voltage $V_{ur}$ creates a problem in that under conditions of heavily loading the power supply with optional circuitry and under conditions of low line voltage the capacitor is charged to a voltage level insufficient to reliability operate the motor. To overcome this problem a transformer with a higher secondary voltage could be used. However, to maintain proper regulation, the capacity of the transformer would have to be increased proportionally. This would result in a physically larger transformer and higher cost. In general, electricity meters do not include excessive space to accommodate larger components, and cost is always a concern.

Moreover, using a larger transformer would result in higher losses which reduces efficiency and increases internal heating.

One potential solution involves the use of a switched-mode supply. Use of switched-mode technology in place of a linear power supply is undesirable due to the increased complexity and cost and the potential for reduced reliability. Moreover, use of a higher secondary voltage transformer in conjunction with a switch mode DC regulator is also considered undesirable for reasons of complexity, cost, and the impact of accommodating the higher electrical noise associated with switched-mode typology.

There is a need, therefore, for low cost means to provide a larger voltage for the purposes of charging a motor drive circuit.

SUMMARY OF THE INVENTION

At least some embodiments of the invention address the above stated need, as well as others, by employing a power supply arrangement for an electricity meter that includes two outputs, including one that provides a boosted voltage. The boosted voltage may be used to charge a capacitor that provides excess power to an actuator circuit such as a motor that operates a switch.

A first embodiment of the invention is a power supply arrangement for an electricity meter that includes an input, a full wave rectifier, and a voltage doubler circuit. The input is configured to receive a periodical input signal. The full wave rectifier is coupled to the input and has a first output. The first output is coupled to a first load of the electricity meter. The voltage doubler circuit is coupled to the input and has a second output coupled to a second load of the electricity meter. The voltage doubler is configured to prevent the flow of current from the second output to the input.

The above-described features and advantages, as well as others, will become apparent to those of ordinary skill in the art by reference to the following detailed description and accompanying drawings.

DESCRIPTION

Figure 1:
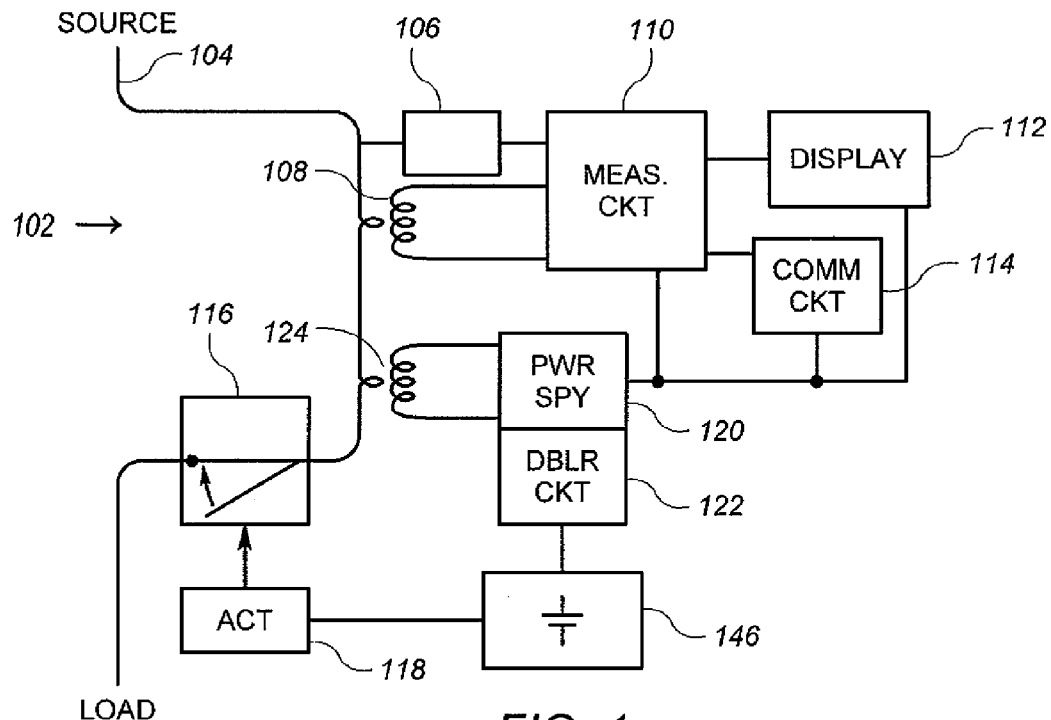
FIG. 1 shows a block diagram of a first embodiment of an arrangement according to the invention within the context of an electricity meter.

FIG. 1 shows a block diagram of a first embodiment of an arrangement according an exemplary embodiment of the invention. FIG. 1 shows an electricity meter 102 coupled to a power line 104. The power line 104 delivers electrical power from a source, which may be a utility "mains" power line, to a load, which may be an electrical system of a residence, commercial building or industrial building. It is noted that the power line 104 shown in representative form only as a single conductor. It will be appreciated that those of ordinary skill in the art may readily adapt the elements of the electricity meter 102 for single phase or polyphase metering systems using any known metering form.

The electricity meter 102 includes sensor circuitry 106, 108, a metrology circuit 110, a display 112, and a communication circuit 114. The electricity meter 102 also includes a disconnect switch 116. The disconnect switch 116 is configured to controllably break and make the connection through the power line 104. The disconnect switch 116 may thus be used to disconnect the load (or in some cases portions thereof) from the source. As discussed above, disconnect switch 116 may be operated in a situation in which prepaid electricity services have been expended.

The disconnect switch 116 must make and break a connection in a conductor carrying significant electrical power. To this end, the disconnect switch 116 may suitably be a 200 ampere switch. To operate such a switch, an actuator 118 is provided.

In accordance with an embodiment of the invention, the meter 102 includes a power supply arrangement that includes a linear power supply 120 and a voltage boost circuit 122. The linear power supply 120 is operably coupled to provide electrical power to the metrology circuit 110, the display 112 and the communication circuit 114, while the voltage boost circuit 122 is connect to provide electrical power at least indirectly to the actuator 118. The voltage boost circuit 122 provides an output voltage that exceeds that of the linear power supply 120. In some embodiments, the voltage boost circuit 122 comprises what is known in the art as a voltage doubler or voltage multiplier circuit.

In the general configuration of the meter 102, the sensor circuitry 106, 108 includes a voltage sensor 106 and a current sensor 108. In polyphase meters, the sensor circuitry 106, 108 will include multiple voltage sensors and multiple current sensors, as is known in the art. Referring again to the example of FIG. 1, the voltage sensor 106 is operably coupled to sense the voltage on the power line 104. To this end, the voltage sensor 106 is any suitable circuit, including any of a plurality of well-known forms, that generates a signal that is representative of the voltage and/or voltage waveform on the power line 104. By way of example, the voltage sensor 106 may comprise a resistive voltage divider that generates a scaled-down version of the power line voltage waveform as an output. Similar to the voltage sensor 106, the current sensor 108 is operably coupled to sense the current on the power line 104. To this end, the current sensor 108 is any suitable circuit, including any of a plurality of well-known forms, that generates a signal that is representative of the current and/or current waveform on the power line 104. By way of example, the current sensor 108 is a toroid device having a center opening through which the power line 104 passes.

The metrology circuit 110 is operably coupled to receive voltage and current measurement signals from the sensors 106, 108. The metrology circuit 110 is configured to, among other things, determine and communicate information regarding power or energy consumption of the load. For example, the metrology circuit 110 may generate metering information in the form of kilowatt-hours, peak demand, $I^2$ hours, apparent energy, reactive energy or other known quantities. Metrology circuits capable of generating such metering information are well known in the art. By way of example, it is well known to digitally sample the voltage and current waveform signals (such as those provided by the sensors 106, 108), multiply multiple contemporaneous voltage and current samples together, and accumulate the multiplied products over time to generate watt-hour information. It is likewise known to calculate apparent power by generating RMS voltage and RMS current values using the voltage and current waveform signals provided by the sensors 106, 108, and then multiplying the RMS voltage by the RMS current. Other methods of generating such values, as well as other useful metering values, using sampling of voltage and current measurement signals, are well known in the art.

The metrology circuit 110 also will typically include a meter controller, such as a processor circuit or microcontroller circuit, that controls the overall operations of the meter 102 including control over display and communication operations. Such meter architectures are known in the art.

The display circuit 112 is preferably an LCD display and associated driving circuitry. The display circuit 112 is operably coupled to the metrology circuit 110. The display circuit 112 is suitably configured to provide a visual indication of information regarding the metering values generated by the metrology circuit 110. Suitable display circuits are well known in the art and may include various other features.

The communication circuit 114 is a device that facilitates communication of information between the metrology circuit and an external computer or other device. To this end, the communication circuit 114 may include an optical port or other port that facilitates local communication. The communication circuit 114 may instead, or in addition, include a modem that facilitates communication to a remote location over a communication medium. By way of example, the communication circuit 114 may include a power line modem that facilitates communication with a remote, centralized facility over the power line 104. In another example, the communication circuit 114 includes an RF modem that facilitates communications using RF signals and a wireless network.

In one embodiment, the communication circuit 114 is configured to be able to receive a signal from a remote device that includes a command to open (and optionally to close) the switch 116. The communication circuit 114 is further configured to communicate that information to the actuator 118 directly, or through the intervention of the control circuit within the metrology circuit 110.

The switch 116, as discussed above, is operably connected to controllably break or make a connection in the power line 104. To this end, the switch 116 has at least one mechanically movable contact that may be moved to close or break the connection in the power line 104. The open or closed position of the switch 116 is controlled by the actuator 118, which may suitably be a motor, not shown. The actuator 118 causes the switch 116 to open or close in response to control signals, for example, received from the metrology circuit 110, the communication circuit 114 or any other circuit that includes control logic.

The power supply 120 is preferably a linear supply. The power supply 120 is operably connected provide power to various circuits of the meter 102 include the metrology circuit 110, the display 112, and the communication circuit 114. The power supply 120 is preferably coupled to obtain power from the power line 104 via a transformer 124. The voltage boost circuit 122 is operably connected to the power supply 120 and is configured to provide a voltage that is higher than the output voltage of the power supply 120.

The voltage boost circuit 122 is operably coupled to provide the increased output voltage to an energy storage unit 126 within the meter 102. The energy storage unit 126, which may suitably be one or more capacitors, is capable of storing a voltage that is higher than the output voltage of the power supply 120. The energy storage unit 126 is operably coupled to provide the stored higher voltage to the actuator 118 to provide the power necessary to operate the actuator 118, at least on a temporary basis. In particular, when the actuator 118 is not operating, which is most of the time, the energy storage unit 126 is charged to the charge voltage (which exceeds the output voltage of the power supply 120) by the voltage boost circuit 122. When the actuator 118 operates to open (or close) the switch 116, the energy storage unit 126 discharges its stored charge to the actuator 118. The actuator 118 converts the electrical energy from the energy storage unit 126 to motive energy to operate the switch 116. After the actuator 118 opens or closes the switch 116, the boost circuit 122 recharges the energy storage unit 126.

As discussed above, it is noted that the boost circuit 122 may suitably include or comprise a voltage doubler circuit. It will be appreciated that the phrase "voltage doubler" circuit as used herein means a circuit that is configured to boost a voltage from an AC source, and does not necessarily require an exact "doubling" of an input voltage. The phrase "voltage doubler" refers to the fact that circuit has the general architecture to substantially double the input voltage. The phrase "voltage doubler" circuit should also be considered to incorporate similar voltage multipliers that include more than one doubler stage.

An advantage of the above described embodiment is that increase voltage may be provided to the actuator 118 on a periodic basis without requiring a higher voltage linear power supply 120. Instead, the voltage boost circuit 122 allows a higher voltage to be stored in the energy storage unit 126, which in turn may be used on a temporary basis to provide relatively high power to the actuator 118.

Figure 2:
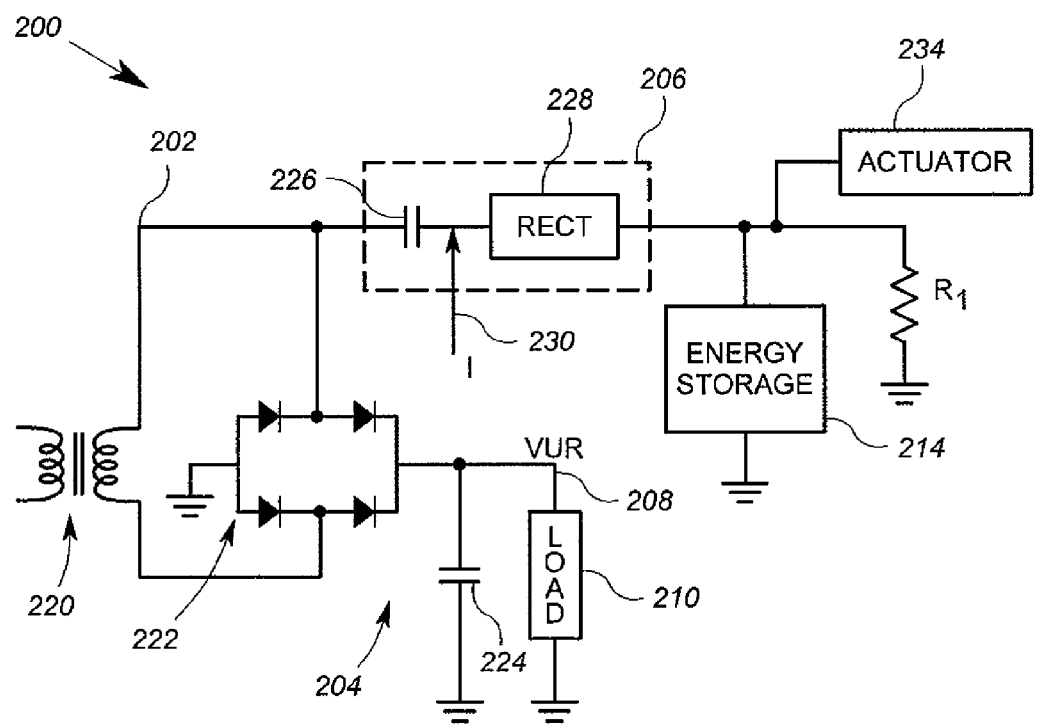
FIG. 2 shows in further detail an exemplary embodiment of the arrangement of FIG. 1.

FIG. 2 shows an exemplary embodiment of the power supply arrangement of FIG. 1 including some of the context from the meter 102. More specifically, FIG. 2 shows a power supply arrangement 200 for an electricity meter that includes an input 202 configured to receive a periodical input signal. The arrangement 200 also includes a full wave rectifier 204 and a voltage boost circuit 206. The full wave rectifier 204 is coupled to the input 202 and has a first output 208. The first output 208 is coupled to a first load 210 of an electricity meter. By way of example, the first load 210 includes the metrology, communication and/or display circuits of the meter.

The voltage boost circuit 206 is coupled to the input 202 and has a second output 212 coupled to a second load 214 of the electricity meter. The voltage boost circuit 206 includes a rectifying element and/or is otherwise configured to prevent the flow of current from the second output 212 to the input 202.

In further detail, the input 202 may suitably comprise a terminal of a secondary winding of a power supply transformer 220. The power supply transformer 220 may suitably be an embodiment of the transformer 124 of FIG. 1. The power supply transformer 220 converts the voltage from the power line (e.g. power line 104 of FIG. 1) to a lower voltage that is employed by the rectifier circuit 204 to generate a suitable power supply voltage for the circuits of the first load 210, which may include metrology, communication, control and display circuits. The power supply transformer 220 does not, however, provide voltage that would be, when converted to DC by a rectifier circuit, sufficient for the second load 214.

In any event, the rectifier circuit 204 comprises all or part of a full-wave linear power supply that generates a first output voltage VUR at the output 208. To this end, the rectifier circuit 204 includes a diode bridge 222 and a smoothing capacitor 224. The voltage VUR is provided to the first load 210. The voltage VUR is unregulated in the full wave linear power supply formed by the rectifier circuit 204. Thus, the load 210 may include, in addition to metrology, control, communication, and/or display circuits, voltage regulator devices that receive the voltage VUR and generate regulated output voltages.

The voltage boost circuit 206 includes a capacitor 226, a rectifying device 228, and a source of current 230. The capacitor 226 and the rectifying device 228 are series coupled between the input 202 and the second output 212. The current source 230 is coupled between the capacitor 226 and the rectifying device 228. The current source 230 typically will also include a rectifier, not shown. Further detail regarding examples of suitable boost circuits are provided below in connection with FIGS. 3 to 5.

In general, the voltage boost circuit 206 in several embodiments is configured as a voltage doubler that operates to increase the voltage from the AC input voltage received at the input 202.

The second load 214 in this embodiment is an energy storage circuit, such as the energy storage circuit 126 of FIG. 1. The second load 214 in any event requires or employs a voltage that exceeds that of the voltage VUR. In the embodiment, which corresponds to the embodiment of FIG. 1, the energy storage element of the second load 214 is coupled to an actuator 234. The actuator 234 may suitably be the actuator 118 of FIG. 1.

Figure 3:
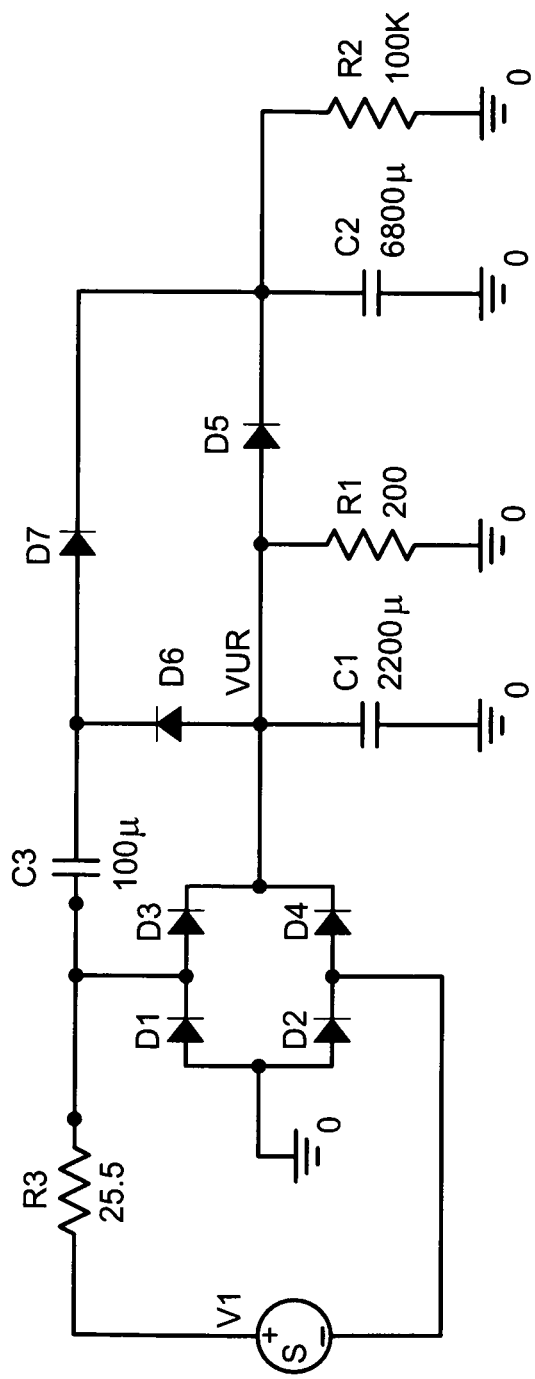
FIG. 3 shows in further detail an exemplary embodiment of the arrangement of FIG. 2.
Figure 4:
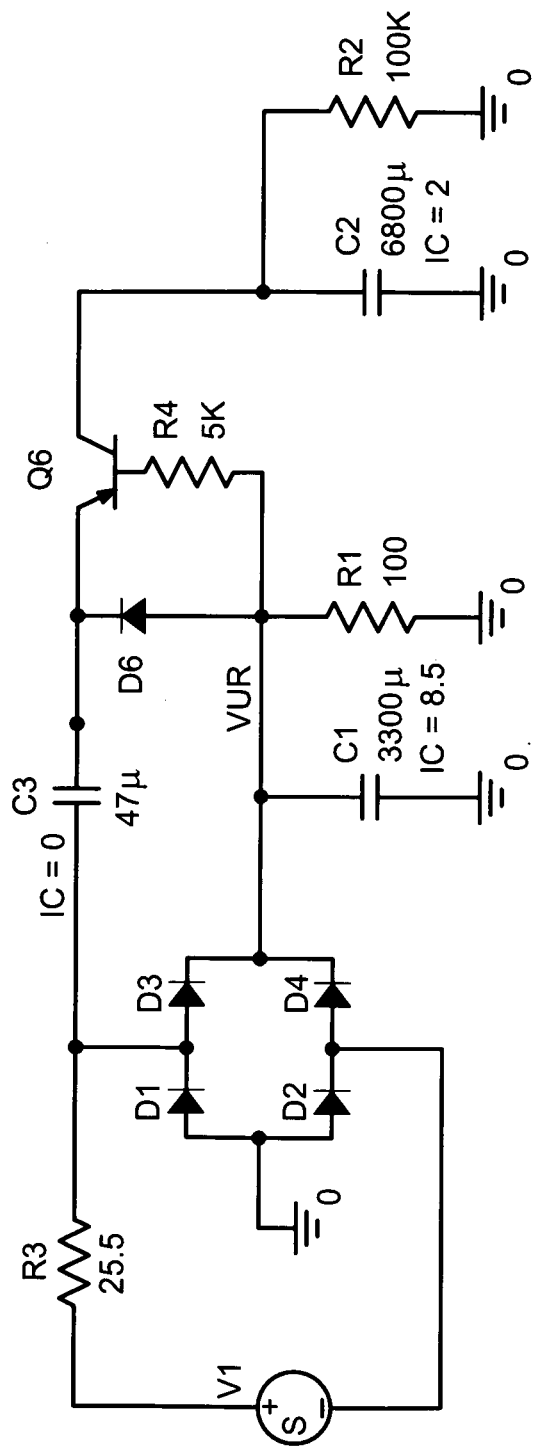
FIG. 4 shows in further detail a first alternative embodiment of the arrangement of FIG. 2.
Figure 5:
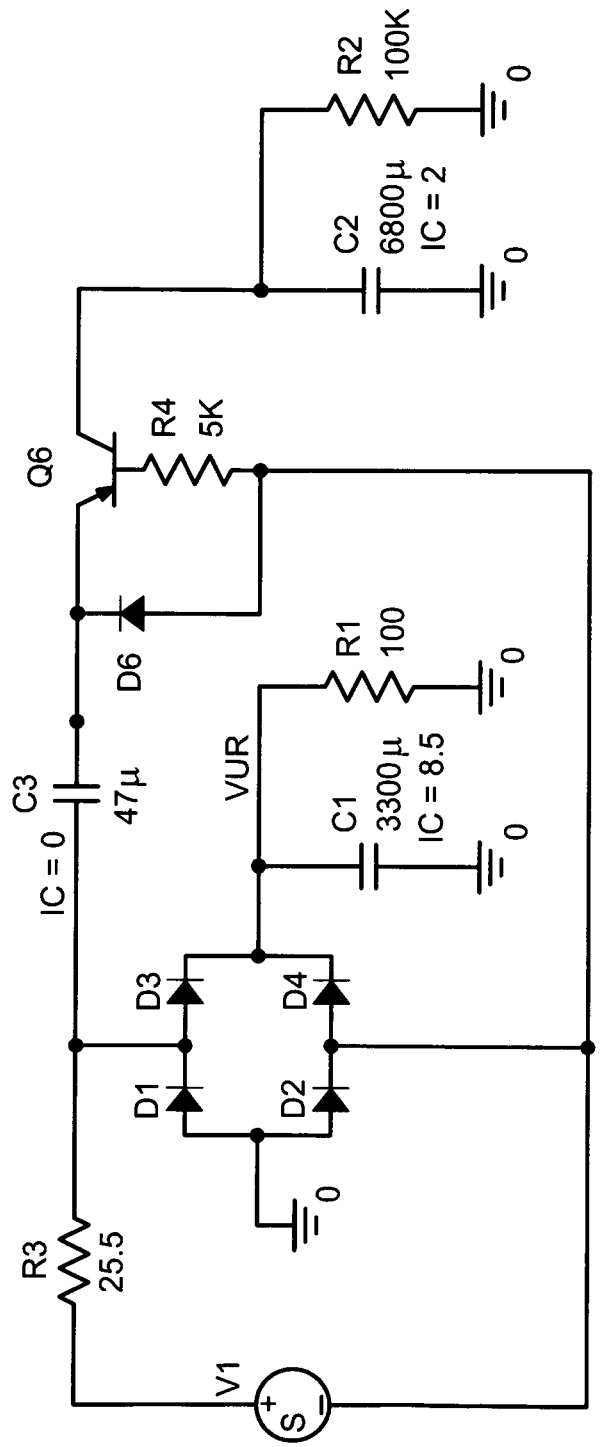
FIG. 5 shows in further detail a second alternative embodiment of the arrangement of FIG. 2.

Thus, FIG. 2 provides in further detail an exemplary embodiment of the power supply arrangement shown in FIG. 1. FIGS. 3 to 5 show specific examples of the power supply arrangement of FIG. 2. In FIGS. 3 to 5, the transformer 220 of FIG. 2 is represented by its equivalent circuit of a voltage source V1 and a resistor R3. The voltage source V1 is the voltage provided by the secondary winding of the transformer 220 and the resistor R3 is used to model the transformer's impedance. V1 has a typical range of 11.7 VRMS minimum to 17.5 RMS maximum.

Referring now to the embodiment of FIG. 3, diodes D1-D4 in conjunction with C1 form the linear DC supply. Resistor R1 represents the first load, i.e. the first load 210 of FIG. 2, which may include metrology, communication and/or display circuitry of a meter. At minimum input voltage and maximum load current, the voltage on C1 ($V_{ur}$) can be as low as approximately 9 volts in this embodiment. The capacitor C2 in this embodiment represents the storage element or second load 214 of FIG. 2. The capacitor C2 is used as a motor drive capacitor that needs to be charged to a voltage of approximately 16 volts. Consequently, if $V_{ur}$ is used to charge capacitor C2 the needed voltage of 16 volts will not necessarily be achieved under varying operating conditions.

In FIG. 3, capacitor C3 and diodes D5, D6, and D7, make up the voltage boost circuit used to charge C2 to a maximum of approximately 2 times $V_{ur}$. This is accomplished similar to the operation of a typical voltage doubler circuit. A difference between the present invention and a typical voltage doubler circuit is that voltage doubling operation of this device is achieved in conjunction with a full wave bridge circuit. The full wave bridge is used to provide DC power ($V_{ur}$) to the first load (represented by R1), and the voltage doubler charges the motor drive capacitor C2 to approximately 2 times $V_{ur}$.

Under normal operation, capacitor C2 charges to full voltage of at least 16 volts. As discussed above in connection with FIG. 1, this may occur during normal operation of the meter 102, when there is no command to change the state of the switch 116. However, when a command is given to either open or close the switch, the capacitor C2 is electrically connected directly, via a switch, not shown, to the motor, also not shown in FIG. 3. The capacitor C2 discharges down to about 2 volts, which is the forward voltage drop of a solid state switch (not shown). Once discharged, the capacitor C2 is disconnected from the motor and allowed to charge up to maximum voltage before a subsequent operation is performed.

In FIG. 3, the capacitor C2 charges from both the voltage doubler circuit and from the full wave bridge $V_{ur}$ until the voltage reaches $V_{ur}$ minus the voltage drop across D5. Then the voltage across C2 continues to increase to approximately 2 times $V_{ur}$ from the voltage doubler operation. Thus, the embodiment of FIG. 1 employs both the unregulated rectified voltage output $V_{ur}$ and a voltage doubler (C3, D5, D6, D7) to charge the capacitor C2. The time to charge from 0 volts up to $V_{ur}$ is typically much shorter than the time required to charge from $V_{ur}$ to 2 times $V_{ur}$ because more current can be supplied from the full wave bridge compared to the current supplied through C3. However, current through C3 can be increased by increasing the value of C3.

In another embodiment, the diode D5 is removed from the circuit of FIG. 3. In this embodiment, the circuit performs almost the same as the circuit of FIG. 3. The difference is that during the first portion of the charging cycle C2 only charges to $V_{ur}$ minus the voltage drop across both D6 and D7. Then the voltage across C2 continues to increase to approximately 2 times $V_{ur}$ because of the voltage doubler circuit.

It is possible, however, in these embodiments, that $V_{ur}$ can droop somewhat during the first stage where C2 is being charged directly by $V_{ur}$. This temporary drop in $V_{ur}$ may be undesirable with respect to other elements in the circuit, such as those that receive power from $V_{ur}$.

Other alternative embodiments of the arrangement of FIG. 2 address this issue. In particular, FIG. 4 shows an embodiment that tends to minimize the droop in $V_{ur}$ when C2 is being charged. Droop is reduced by charging C2 only from the voltage boost circuit comprising C3 and not directly from $V_{ur}$. To this end, a transistor Q6 replaces the diode D7. The transistor Q6 is controlled such that C3 is charged from $V_{ur}$ during ½ cycle of the 60 Hertz input power. During the next half cycle the charge on C3 is transferred to C2. After several cycles C2 will be charged to approximately 2 times $V_{ur}$. During the half cycle C3 is being charged from $V_{ur}$ diode D6 is forward biased and transistor Q6 is not conducting and therefore no current is flowing into C2. During the next half cycle the emitter voltage of Q6 increases above $V_{ur}$ and transistor Q6 turns on and charge is transferred to C2. In this way current never flows directly from $V_{ur}$ into C2.

FIG. 5 shows a slight variation of the above described embodiment. In the above-described embodiment of FIG. 4, wherein the transistor Q6 replaces D7 of FIG. 3, and D5 of FIG. 3 is eliminated, the capacitor C3 is charged from current flowing from $V_{ur}$. The additional current needed to charge C3 flowing through the bridge rectifier increases the voltage drop across the bridge rectifier resulting in a larger droop of $V_{ur}$. To reduce this droop, the circuit of FIG. 5 uses the current that comes directly from the bridge input to charge C3. Consequently, no additional voltage drop is produced across the bridge rectifiers, thereby minimizing the droop of $V_{ur}$. Ideally Q6 would have a relatively high gain such as 100 so that the base current needed to turn on Q6 is minimized. Current flowing through the base of Q6 is in a sense wasted because it does not transfer to C2 and therefore does not contribute to charging C2. The circuit of FIG. 4 minimizes the time it takes to charge the motor drive capacitor while minimizing the droop in $V_{ur}$ during the charging cycle.

It will be appreciated that the above described embodiments are merely exemplary, and that those of ordinary skill in the art may readily devise their own modifications and implementations that incorporate the principles of the present invention and fall within the spirit and scope thereof.

We claim:

1. A power supply arrangement for an electricity meter, the arrangement comprising:
   an input configured to receive a periodical input signal;
   a linear power supply coupled to receive the periodic input signal at the input and having a first output, the first output operably coupled to provide bias power to a first load including at least a part of metrology circuitry of the electricity meter;
   a voltage doubler circuit coupled to the input and having a second output coupled to a second load of the electricity meter, the voltage doubler circuit including a rectifier operably coupled to prevent the flow of current from the second output to the input.

2. The power supply arrangement of claim 1, wherein the second load comprises a chargeable energy storage element, the chargeable energy storage element configured to provide power to a motor.

3. The power supply arrangement of claim 1, wherein the second load includes a motor.

4. The power supply arrangement of claim 1, wherein the first output comprises an unregulated voltage output; and wherein the first load further includes at least one voltage regulator device.

5. The power supply arrangement of claim 1, wherein the input comprises a secondary winding of a transformer.

6. The power supply arrangement of claim 1, wherein the second load includes an actuation device.

7. An arrangement for an electricity meter, comprising:
   a first load;
   a second load including an energy storage element connected to an actuator;
   an input configured to receive a periodical input signal;
   a power supply including a full wave rectifier and a capacitor, the power supply operably coupled to receive the periodic signal from the input and provide bias power to the first load;
   a voltage boost circuit coupled between the input and operably connected to provide a bias voltage to the second load, the bias voltage exceeding a voltage provided to the first load.

8. The arrangement of claim 7, wherein the first load includes metrology circuitry.

9. The arrangement of claim 7, wherein the first load is coupled at a first output, and further comprising a first diode coupled between the first output and the voltage boost circuit.

10. The arrangement of claim 9, wherein the voltage boost circuit includes a capacitor connected in series with a semiconductor element, and wherein the second load is operably connected to receive the bias voltage from the semiconductor element.

11. The arrangement of claim 10, wherein the semiconductor element is a second diode.

12. The arrangement of claim 10, wherein the semiconductor is a transistor having a control terminal and output terminals, and wherein the output terminals are series connected with the capacitor.

13. The arrangement of claim 12, wherein the control terminal of the transistor is coupled to the first output via a resistor.

14. The arrangement of claim 7, wherein the voltage boost circuit includes a capacitor connected in series with a semiconductor element, and wherein the second load is operably connected to receive the bias voltage from the semiconductor element.

15. The arrangement of claim 14, wherein the semiconductor element is a transistor having a control terminal and output terminals, and wherein the output terminals are series connected with the capacitor.

16. The arrangement of claim 15, wherein the control terminal of the transistor is coupled to a first node via a resistor, and wherein a second diode is coupled between the first node and a node located between the capacitor and the output terminals of the transistor.

17. A power supply arrangement for an electricity meter, the arrangement comprising:
   an input configured to receive a periodical input signal;
   a full wave rectifier coupled to the input and operably coupled to provide a rectified output voltage to a first load of the electricity meter;
   a first circuit coupled to the input so as to bypass the full wave rectifier and having a second output coupled to a second load of the electricity meter, the first circuit having an output voltage at the second output that exceeds the rectified output voltage, the first circuit including a capacitor connected in series with a semiconductor element, and wherein the second output is connected to the semiconductor element.

18. The arrangement of claim 17, wherein the semiconductor element is a transistor having a control terminal and output terminals, and wherein the output terminals are series connected with the capacitor.

19. The arrangement of claim 18, wherein the control terminal of the transistor is coupled to a first node via a resistor, and wherein a second diode is coupled between the first node and a node located between the capacitor and the output terminals of the transistor.

20. The arrangement of claim 17, further comprising a capacitor operably coupled to the full wave rectifier to provide the rectified output voltage to the first load.

* * * * *